United States Patent [19]

Gould

[11] 3,986,944

[45] Oct. 19, 1976

[54] METHOD FOR OBTAINING ADHESION OF MULTILAYER THIN FILMS

[75] Inventor: Floyd T. Gould, Oklahoma City, Okla.

[73] Assignee: Honeywell Information Systems, Inc., Waltham, Mass.

[22] Filed: June 27, 1975

[21] Appl. No.: 590,815

[52] U.S. Cl. .............................................. 204/192
[51] Int. Cl.² ....................................... C23C 15/00
[58] Field of Search ................................. 204/192

[56] References Cited
UNITED STATES PATENTS

| | | | |
|---|---|---|---|
| 3,278,407 | 10/1966 | Kay | 204/192 |
| 3,515,663 | 6/1970 | Bodway | 204/298 |
| 3,607,697 | 9/1971 | Shirn et al. | 204/192 |
| 3,616,401 | 10/1971 | Cunningham et al. | 204/192 |
| 3,616,406 | 10/1971 | Turner | 204/192 |
| 3,717,563 | 2/1973 | Revitz et al. | 204/192 |
| 3,729,406 | 4/1973 | Osborne et al. | 204/192 |
| 3,809,635 | 5/1974 | Gillot et al. | 204/192 |
| 3,835,007 | 9/1974 | Ferat et al. | 204/192 |

FOREIGN PATENTS OR APPLICATIONS 1,117,009 12/1968 United Kingdom ................ 204/192

OTHER PUBLICATIONS

E. L. Hollar et al "Composite Film Metallizing For Ceramics, J. Electrochem. Soc., vol. 117, pp. 1461–1462, Nov. 1970.

Primary Examiner—John H. Mack
Assistant Examiner—Aaron Weisstuch
Attorney, Agent, or Firm—Ronald T. Reiling; Nicholas Prasinos; William F. White

[57] ABSTRACT

A method for obtaining adhesion of multilayer thin films through the use of a conventional sputtering system. The adhesion between the multilayer thin films is obtained by forming a graded interface between a deposit material and a substrate using an adhesion layer material. The graded interface is formed by sputtering a uniform layer of the adhesion layer material on the surface of the deposit material. The deposit material is coated on a sputtering cathode. The subsequent sputtering from this cathode results in the graded interface between the deposit material and substrate due to the radially non-uniform rate of removal of the adhesion layer material and deposit material from the cathode's surface.

5 Claims, 9 Drawing Figures

COMPOSITION OF MATERIAL BEING SPUTTERED
AS OF FUNCTION OF TIME

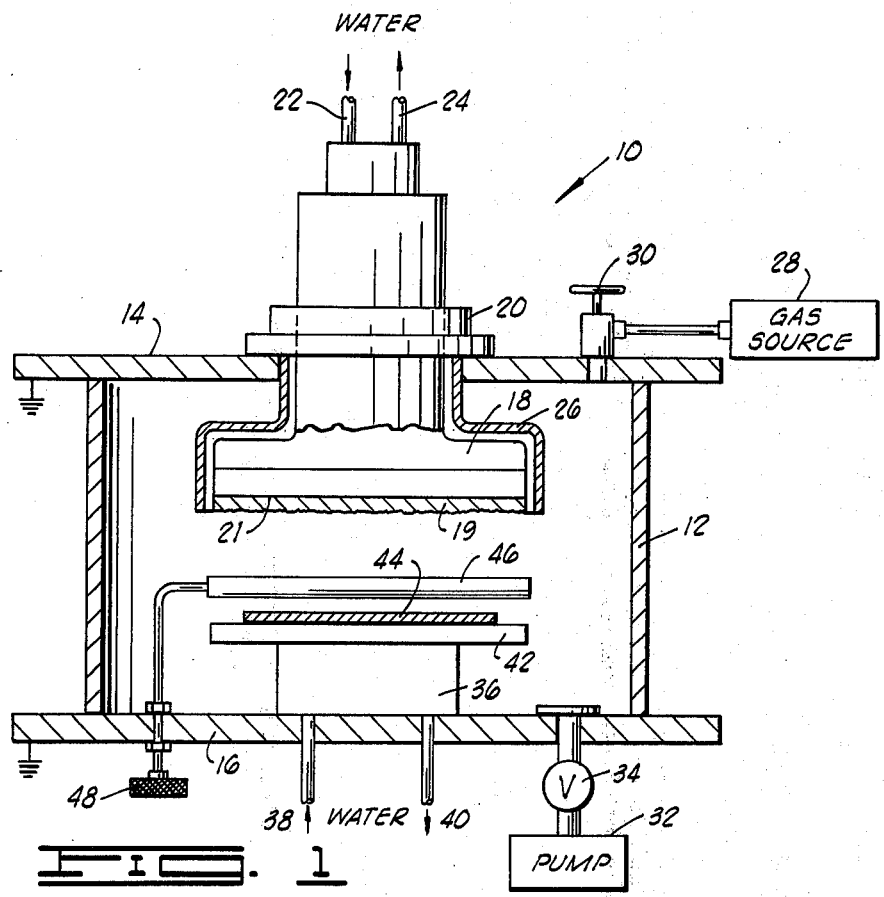
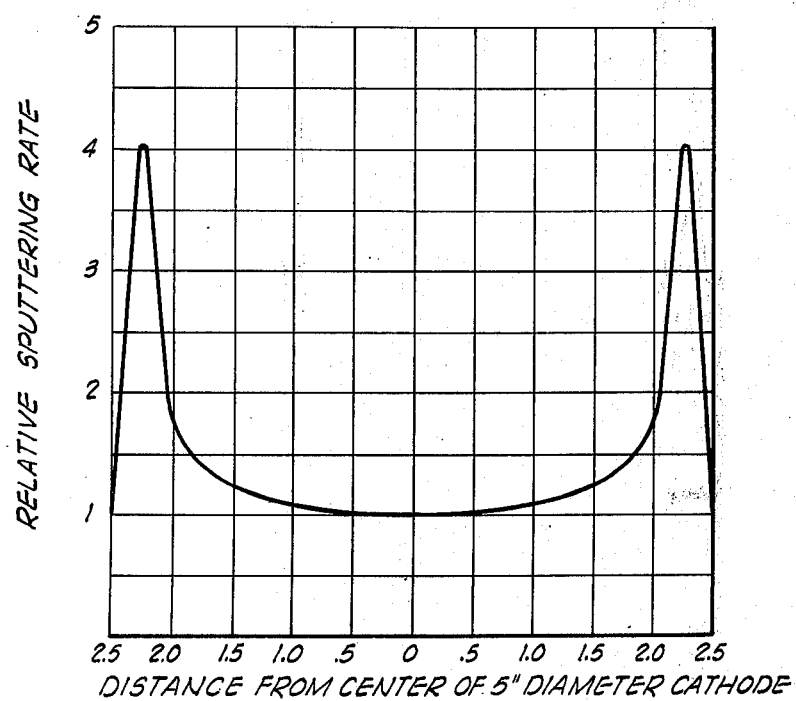

COMPOSITION OF MATERIAL BEING SPUTTERED
AS OF FUNCTION OF TIME

METHOD FOR OBTAINING ADHESION OF MULTILAYER THIN FILMS

BACKGROUND OF THE INVENTION

It is often difficult to fabricate multilayer thin film solid state devices and transducers because the successive layers of different materials have different surface properties. The surface properties determine whether or not the two materials will adhere to one another. If a material forms an oxide coating on its surface upon the exposure to the air (i.e., aluminum), it is the properties of the oxide layer which determines the material's surface properties and if it will adhere to the surface of a different material. In the sputtering of two materials with unlike surface properties, a sharp interface is formed therebetween resulting in a cleavage plane.

In the sputtering of thin films, it is common practice to use an adhesion layer material to improve the adhesion between the deposit material and the substrate. This method works well when it is possible to find an adhesion layer whose surface characteristics are compatible with both the material to be deposited and the substrate. But, in thin film technology, it is often found that the adhesion layer may have surface characteristics similar to either the deposit material or the substrate but not both. This limitation restricts the use of a broad range of materials used as the deposit material or as the adhesion layer.

While two materials may have surface properties that will not allow one to adhere to the other, the bulk properties of the same materials may be very compatible and during the sputtering operation combine with each other forming a graded interface with no cleavage plane and a good crystalline bond therebetween. The term "graded interface", as used in this description, is a blending of the deposit material and the adhesion layer materials as the materials are sputtered onto the substrate thereby forming a strong crystalline bond with the surface of the substrate.

The subject invention takes into consideration materials having compatible bulk characteristics irrespective of the surface properties of the same materials.

SUMMARY OF THE INVENTION

The present invention produces a graded interface between thin layers of materials having like bulk properties. The graded interface having no well defined interface between the materials where separation can occur.

Adhesion of the multilayer thin films is obtained by using an adhesion layer having bulk properties similar to aluminum. Pure aluminum is adherent to substrates such as silica, glass, alumina, etc. But, an oxidized aluminum surface is not particularly adherent to deposit materials such as copper, gold, etc. But, if a graded interface between the copper, gold, etc., and the pure aluminum is formed, the deposit material is adherent to the above substrates.

The method for obtaining adhesion of multilayer thin films includes the step of sputtering the adhesion layer onto the deposit material forming a uniform layer of the adhesion material on the deposit material. The adhesion layer material is now removed from the deposit material by sputtering until a thin film of the adhesion layer is left on the deposit material. Because of the characteristics of the sputtering apparatus, the adhesion layer is removed nonuniformly from the radial surface of the sputtering cathode. The adhesion layer material is removed more rapidly from the outer periphery of the cathode than from the inner periphery of the cathode. The remaining thin film of the adhesion material and the deposit material are now sputtered onto the substrate. Because of the nonuniform removal of the adhesion layer and the deposit material from the cathode, the sputtering of the adhesion layer and the deposit material form a graded interface between the substrate and the deposit material.

The advantages and objects of the invention will become more apparent when read in conjunction with the following detailed description of the drawings.

BRIEF DESCRIPTION OF THE DRAWINGS

FIG. 1 illustrates a standard sputtering apparatus for forming thin film materials on a substrate.

FIG. 2 illustrates the removal rate of a material on a 5 inch diameter cathode used in the sputtering apparatus.

DETAILED DESCRIPTION OF THE DRAWINGS

Figure 3:
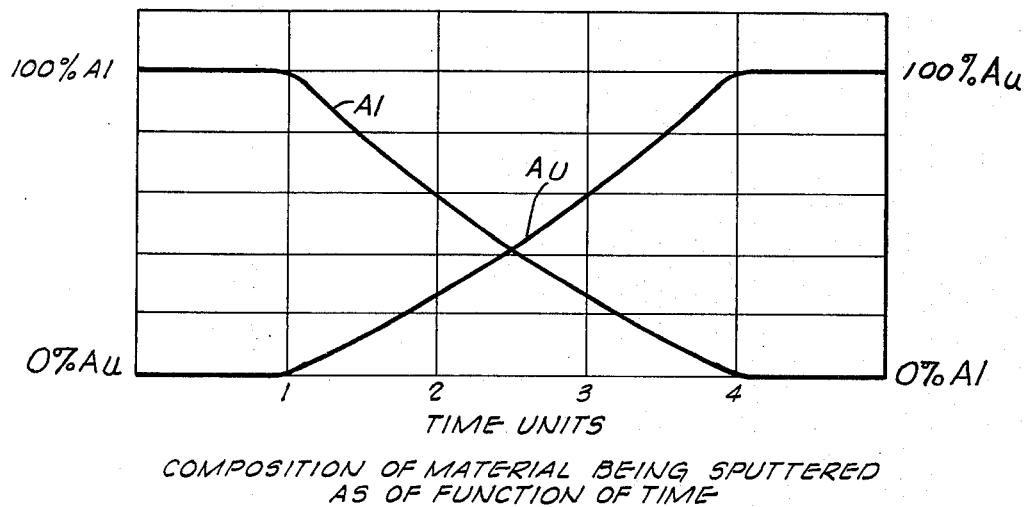
FIG. 3 illustrates the percent of the material removed from the cathode in relation to time.

In FIG. 1, a standard sputtering apparatus is designated by general reference character 10. The apparatus 10 includes a glass chamber 12 mounted between a metal top plate 14 and a metal bottom plate 16. A sputtering cathode 18 is held in position by a collar 20 attached to the top plate 14. The cathode 18 is water cooled by circulating water through inlet pipe 22 and outlet pipe 24. The cathode 18 is shown having a thin layer of gold 19 on the cathode surface 21. A shield 26 is mounted to the top plate 14 and surrounds the outer circumference of the cathode 18. A gas source 28, such as argon or oxygen, is introduced into the chamber 12 by valve 30. A vacuum is provided inside the glass chamber 12 by vacuum pump 32 controlled by a valve 34.

An anode 36 is attached to bottom plate 16 and is water cooled by an inlet pipe 38 and an outlet pipe 40. The anode 36 includes a substrate holder 42 holding a substrate 44. The substrate 44 is protected from receiving unwanted sputtered material by a movable shutter 46 controlled by a manual turning knob 48. Both the cathode 18 and the anode 36 are connected to electrical sources (not shown) to provide an electrical potential between the cathode and the anode thereby controlling the flow of the sputtered material in a desired direction.

FIG. 2 illustrates the relative rate of material removed from the surface of a 5 inch diameter cathode as a function of the distance from the center of the cathode. The area around the outer periphery of the cathode is removed at a rate of approximately 4 to 1 when compared to the area of the inner periphery of the cathode. This relative sputtering rate can be controlled by the increase or decrease of the electrical potential between the cathode and the anode. The removal rate is of importance because the material is removed nonuniformly across the surface of the cathode thereby providing the graded interface between the deposit material and the adhesion layer as the materials are sputtered onto the substrate.

FIG. 3 illustrates the composition of materials being sputtered as a function of time. In this example, pure aluminum is used as an adhesion layer and the deposit material used is gold. While the following detailed description of the subject invention discusses the use of gold as a deposit material and pure aluminum as the adhesion layer, it is recognized that there are materials having similar surface and bulk characteristic properties that can be used equally well in the sputtering apparatus 10 for forming thin films on the substrate 44. The substrate 44 can be made of silicon, glass, alumina, or the like. When the material is sputtered initially, 100 percent of the aluminum is deposited for the first unit of time. Thereafter for three units of time, a mixture of the aluminum and gold are deposited on the substrate. After this length of time, 100 percent gold is deposited until the desired thickness of the thin film on the substrate is achieved. The mixture of the aluminum and gold provides the graded interface between the substrate and the deposit layer.

Figures 4, 5:
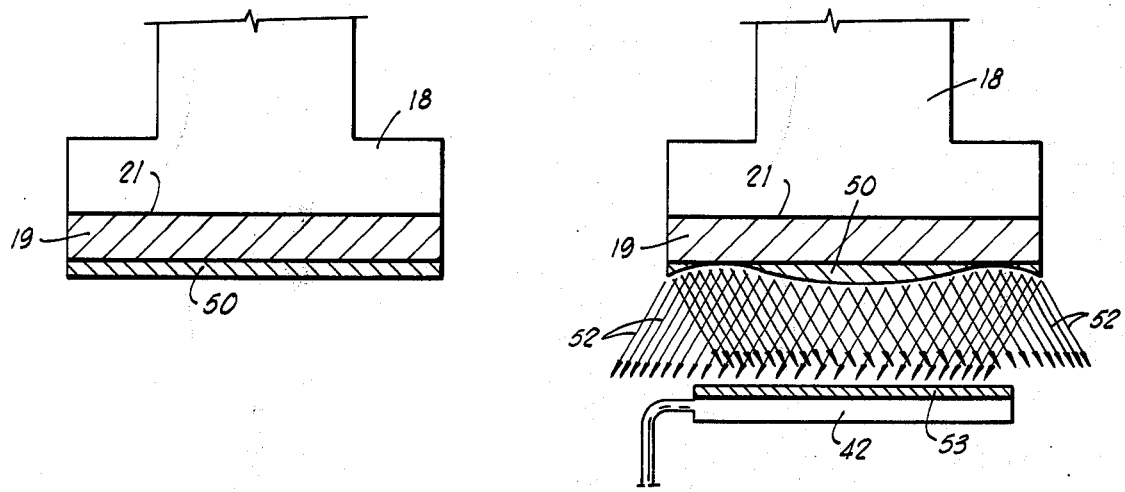
FIGS. 4 through 7 illustrate the method of forming a graded interface using the sputtering apparatus.

FIG. 4 shows a cross-section of the cathode 18 having a layer of gold deposit material 19 covering its surface 21. On top of the layer of gold deposit material is sputtered a pure aluminum adhesion layer 50. For the purpose of illustration, the cross-section of the layers of gold, aluminum and the graded interface discussed in the following description are shown greatly enlarged.

In FIG. 5, the sputtering of the adhesion layer 50 is shown. In this illustration, the surface of the pure aluminum is cleaned. The sputtering of the pure aluminum is represented by the solid lined arrows 52 which are intercepted by the movable shutter 42. The sputtered aluminum on the movable shutter 42 is represented by a uniform layer 53. It should be recognized while the arrows represent the aluminum being dispersed in two different directions, the aluminum atoms in fact are projected in a multitude of different directions but generally in the direction of the anode 36 (not shown in this Figure). It should also be noted that the aluminum atoms represented by the arrow 52 are in greater concentration in the outer peripheral area of the cathode 18 thereby representing the greater sputtering rate in this area and discussed under the detailed description of FIG. 2. When the surface of the pure aluminum of adhesion layer 50 is cleaned, a thin film of the aluminum adhesion layer 50 remains on the cathode 18 with the thinnest portion of the layer being in the area of the outer periphery of the cathode 18. Again, this is due to the more rapid removal rate in this area rather than in the area of the inner periphery of the cathode 18.

Figure 6:
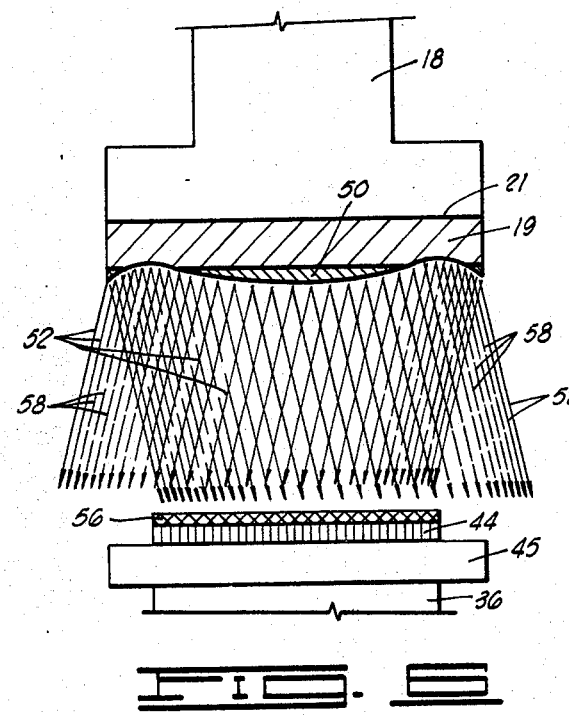

FIG. 6 illustrates the formation of a graded interface 56 of the sputtered aluminum and the sputtered gold. In this Figure, the removable shutter 42 has been removed and the sputtering of the adhesion layer 50 and the deposit material 19 has begun to be deposited on the substrate 44. The pure gold atoms are represented by the broken line arrows 58. Because of the nonuniform removal rate of the sputtering apparatus 10, the adhesion layer 50 is removed at the same time the gold deposit material 19 is exposed at the outer periphery of the cathode 18 and the gold atoms 58 are projected toward the anode 36 at the same time. This results in the intermixing of the aluminum and gold atoms as they are laid down on the surface of the substrate 44 forming the graded interface 56.

Figure 7:
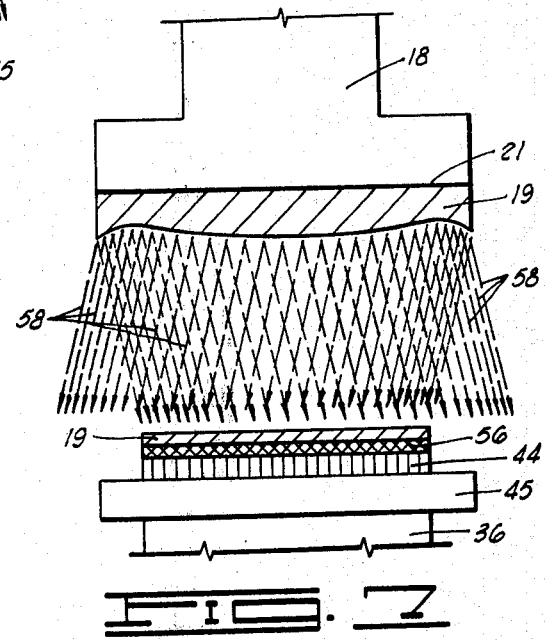

FIG. 7 illustrates the completion of the graded interface 56 and the remaining deposit of the gold deposit material 19 onto the substrate 44. The cross-section of the cathode 18 shows all of the adhesion layer 50 has been removed and the remaining deposit material 19 is now being deposited on the substrate 44. When the desired thickness of the deposit material 19 is achieved, the sputtering apparatus 10 is turned off and the substrate 44 with the thin deposit material 19 having the graded interface 56 is removed.

Figure 8:
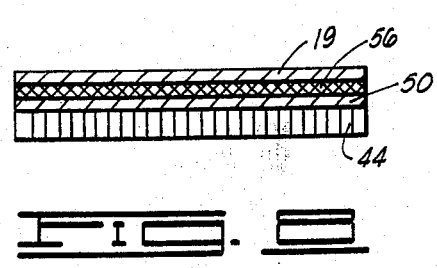
FIGS. 8 and 9 illustrate a cross-section of the deposit material on the substrate with a graded interface.

FIG. 8 represents an alternate embodiment of the subject invention wherein an initial thin film of pure aluminum 50 is sputtered on the substrate 44 prior to forming the graded interface 56 with the deposit material 19. This is accomplished by eliminating the step of sputtering the pure aluminum adhesion layer 50 onto the movable shutter 42, as shown in FIG. 5. By eliminating this step, a pure aluminum layer 50 is formed on the substrate prior to the forming of the graded interface 56 between the gold deposit layer 19 and the pure aluminum layer 50.

Figure 9:
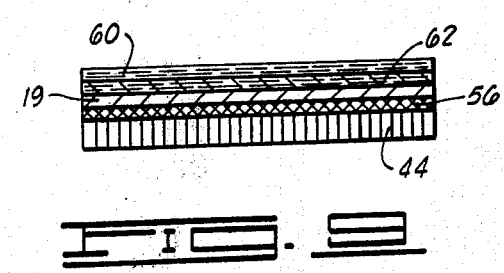

FIG. 9 illustrates another alternate embodiment wherein a second deposit material 60 is used to form a multilayer thin film on the substrate 44. This additional deposit material 60 could be nickel, iron, copper or any other material having like bulk characteristics similar to the adhesion layer. This additional deposit layer 60 would be deposited in the same manner as described in FIGS. 5, 6 and 7 using an adhesion layer similar to adhesion layer 50 and the steps would merely be repeated to form the second deposit material 60 on top of the first deposit material 19. In this illustration, a second adhesion layer is sputtered with the second deposit material 60 forming a second graded interface 62 on top of the deposit material 19.

Changes may be made in the construction and arrangement of the parts or elements of the preferred embodiment as disclosed herein without departing from the spirit or scope of the invention as defined in the following claims.

I claim:

1. A method for obtaining adhesion of multilayer thin films through the use of a sputtering system, the thin films comprising a substrate, an adhesion material, and a deposit material, the steps comprising:

sputtering the adhesion material onto a layer of deposit material mounted on the surface of a sputterable cathode so as to form an outermost layer on the cathode consisting completely of adhesion material;

sputtering the adhesion material layer and the deposit material off of the sputterable cathode and onto the substrate until the desired thickness of the deposit material is reached, the removal of the adhesion material layer and the deposit material off of the sputterable cathode being nonuniform thereby depositing a graded interface on the surface of the substrate.

2. The method as described in claim 1 further including the additional step of sputtering the layer of adhesion material off of the deposit material until only a thin film of the adhesion layer remains, this additional step performed prior to sputtering the remaining adhesion layer and deposit material onto the substrate.

3. The method as described in claim 1 further including the repeating of the steps in claim 1 so as to form an additional layer of deposit material and an additional layer of adhesion material to thereby form a multilayer thin film of deposit materials on the substrate.

4. A method for obtaining adhesion of multilayer thin films through the use of a sputtering system, the thin films comprising a substrate, an adhesion material, and a deposit material, the steps material;

sputtering the adhesion material onto a layer of deposit material mounted on the surface of a sputterable cathode so as to form an outermost layer on the sputterable cathode consisting completely of adhesion material sputtering a portion of the layer of adhesion material from the sputterable cathode onto the substrate;

sputtering a mixture of the remaining adhesion material and the deposit material from the sputterable cathode onto the adhesion layer already formed on the substrate, the mixture forming a graded interface between the adhesion layer on the substrate and the deposit material, the mixture produced by the nonuniform removal of the adhesion material layer and deposit material as they are removed from the sputtering system's sputterable cathode;

sputtering the remaining deposit material onto the substrate until the desired thickness of the deposit material is reached.

5. The method as described in claim 4 further including the repeating of the steps in claim 4 so as to form an additional layer of deposit material and an additional layer of adhesion material to thereby form a multilayer thin film of deposit materials on the substrate.

* * * * *

UNITED STATES PATENT OFFICE
CERTIFICATE OF CORRECTION

PATENT NO. : 3,986,944

DATED : October 19, 1976

INVENTOR(S) : Floyd T. Gould

It is certified that error appears in the above-identified patent and that said Letters Patent are hereby corrected as shown below:

Claim 4, line 6, after "steps" delete "material;" and insert --comprising:--.

Signed and Sealed this

Fourteenth Day of December 1976

[SEAL]

Attest:

RUTH C. MASON
*Attesting Officer*

C. MARSHALL DANN
*Commissioner of Patents and Trademarks*